(12) United States Patent
Chong

(10) Patent No.: US 11,930,709 B2
(45) Date of Patent: Mar. 12, 2024

(54) ELECTRICAL MACHINE AND POWER ELECTRONICS CONVERTER

(71) Applicant: ROLLS-ROYCE plc, London (GB)

(72) Inventor: Ellis F H Chong, Derby (GB)

(73) Assignee: Rolls-Royce PLC, London (GB)

( * ) Notice: Subject to any disclaimer, the term of this patent is extended or adjusted under 35 U.S.C. 154(b) by 284 days.

(21) Appl. No.: 17/572,952

(22) Filed: Jan. 11, 2022

(65) Prior Publication Data

US 2022/0238779 A1 Jul. 28, 2022

(30) Foreign Application Priority Data

Jan. 28, 2021 (GB) ..................................... 2101177

(51) Int. Cl.
*H10N 15/20* (2023.01)
*B64D 27/10* (2006.01)
(Continued)

(52) U.S. Cl.
CPC ............. *H10N 15/20* (2023.02); *B64D 27/10* (2013.01); *B64D 27/24* (2013.01); *B64D 41/00* (2013.01);
(Continued)

(58) Field of Classification Search
CPC ......... F25B 21/00; H10N 15/20; H02K 11/33; H02K 9/227; H02K 5/203; H02K 9/19;
(Continued)

(56) References Cited

U.S. PATENT DOCUMENTS 4,916,907 A * 4/1990 Munk ..................... F25B 21/00
  62/3.1
7,596,955 B2 * 10/2009 Muller .................... F25B 21/00
  62/3.1
(Continued)

FOREIGN PATENT DOCUMENTS

EP         2346146 A1    7/2011
WO    2016038797 A1    3/2016

OTHER PUBLICATIONS

Great Britain search report dated May 6, 2021, issued in GB Patent Application No. 2101177.0.
(Continued)

*Primary Examiner* — Burton S Mullins

(57) ABSTRACT

Integrated arrangements of electrical machines and power electronics converters are described. One such arrangement comprises: an electrical machine comprising one or more windings; a power electronics converter arranged to supply current to or receive current from the one or more windings of the electrical machine; a magnetocaloric effect (MCE) material in thermal contact with the power electronics converter; and a heat sink for removing heat from the MCE material. The MCE material is arranged in proximity to the one or more windings of the electrical machine whereby, in use, stray magnetic flux from the windings of the electrical machine passes through the MCE material and activates the MCE material. The repeated application and removal of the stray flux during normal operation of the electrical machine creates cycles of magnetic refrigeration, which removes heat from the power electronics converter.

20 Claims, 6 Drawing Sheets

(51) Int. Cl.
  *B64D 27/24* (2006.01)
  *B64D 41/00* (2006.01)
  *F02C 6/00* (2006.01)
  *H02K 5/20* (2006.01)
  *H02K 9/19* (2006.01)
  *H02K 9/22* (2006.01)
  *H02K 11/33* (2016.01)
  *H02K 21/14* (2006.01)
  *H02K 99/00* (2014.01)
  *H02N 11/00* (2006.01)
  *B64D 27/02* (2006.01)

(52) U.S. Cl.
  CPC .............. *F02C 6/00* (2013.01); *H02K 5/203* (2021.01); *H02K 9/19* (2013.01); *H02K 9/227* (2021.01); *H02K 11/33* (2016.01); *H02K 21/14* (2013.01); *B64D 2027/026* (2013.01); *B64D 2041/002* (2013.01); *F05D 2220/323* (2013.01)

(58) Field of Classification Search
  CPC ........ H02K 21/14; H02K 99/10; B64D 27/10; B64D 27/24; B64D 41/00; B64D 2027/026; B64D 2041/002; F02C 6/00; F05D 2220/323; H02N 11/00; H02N 11/002
  USPC ................................................. 310/300, 306
  See application file for complete search history.

(56) References Cited

U.S. PATENT DOCUMENTS

| | | | | |
|---|---|---|---|---|
| 7,982,360 | B2* | 7/2011 | Erbil | H10N 15/10 250/338.2 |
| 8,614,527 | B2* | 12/2013 | Nagao | H02K 11/33 310/58 |
| 9,866,150 | B2* | 1/2018 | Zhao | H02N 11/006 |
| 2005/0120720 | A1 | 6/2005 | Fang et al. | |
| 2011/0043058 | A1 | 2/2011 | Heitzler et al. | |
| 2016/0156285 | A1* | 6/2016 | Elgezabal Gómez | H02N 2/186 310/306 |
| 2016/0284456 | A1* | 9/2016 | Lausch | H02K 99/10 |
| 2017/0067670 | A1 | 3/2017 | Kümmlee et al. | |
| 2017/0244353 | A1 | 8/2017 | Reddy et al. | |

OTHER PUBLICATIONS

European Search Report dated Jun. 17, 2022, issued in EP Patent Application No. 22150274.

Gschneidner, K.A., et al., "Thirty years of near room temperature magnetic cooling: Where we are today and future prospects", International Journal of Refrigeration, vol. 31, No. 6, Jan. 25, 2008, pp. 945-961.

* cited by examiner

ELECTRICAL MACHINE AND POWER ELECTRONICS CONVERTER

CROSS-REFERENCE TO RELATED APPLICATIONS

This specification is based upon and claims the benefit of priority from. United Kingdom Patent Application No. 2101177.0, filed on 28 Jan. 2021, the entire contents of which are incorporated herein by reference.

BACKGROUND

Technical Field

This disclosure concerns integrated arrangements of electrical machines and power electronics, particularly but not exclusively for use in propulsion systems of aircraft.

Description of the Related Art

In aerospace, propulsion systems are becoming increasingly electric in their design. As well as hybrid electric and purely electric propulsion systems which use electrical machines to provide some or all of the mechanical power that drives the propulsor(s), so-called 'more electric' engines have been proposed. A more electric engine includes one or more electrical machines coupled to spools or shafts of the engine which can be used to, for example, generate electrical power for engine and aircraft systems, facilitate electric starting of the engine, and transfer mechanical power to and from the shafts to improve engine operability.

Weight can have a significant impact on the performance of aircraft and their propulsion systems. It is therefore desirable, where possible, to reduce the weight of the electrical machines and associated power electronics used in aerospace applications. To this end, it is expected that electrical machines and power electronics converters that supply power to or receive electrical power from the electrical machines will become increasingly integrated in their design. Integration may, for example, allow for a reduction in the weight of the component packaging as well as a reduction of length of cabling between the components.

SUMMARY

The disclosure is directed to an integrated electrical machine and power electronics converter. In the integrated arrangement, stray magnetic flux, i.e. flux that leaks outside of the electrical machine without contributing to the generation of torque (for a motor) or electrical power (for a generator) and is thus usually wasted, is used to activate the magnetocaloric effect (MCE) in a material thermally coupled to the power electronics converter. In this way, stray flux is not completely wasted but is instead used to cool to the power electronics.

Thus, according to a first aspect, there is provided an integrated electrical machine and power electronics converter arrangement, comprising: an electrical machine comprising one or more windings; a power electronics converter arranged to supply current to or receive current from the one or more windings of the electrical machine; a magnetocaloric effect (MCE) material in thermal contact with the power electronics converter; and a heat sink for removing heat from the MCE material. The MCE material is arranged in proximity to the one or more windings of the electrical machine whereby, in use, stray magnetic flux from the windings of the electrical machine passes through the MCE material.

Synergistically, the increase in the efficiency of the converter that results from its cooling may improve the performance of the electrical machine, and may in turn result in a further increase in the cooling of power electronics. For example, if the electrical machine is operated as a motor, the cooling of the converter may allow the converter to supply a higher current to the windings of the motor. As well as increasing the torque produced by the motor, the increase in current in turn creates a higher magnetic flux, including a higher stray flux. The increase in stray flux may be associated with increased cooling of the converter. Such synergy is not achieved in MCE cooling systems in which MCE material is activated not using stray flux, but using a separate source of magnetic flux dedicated to MCE cooling.

According to a second aspect, there is provided an integrated electrical machine and power electronics converter arrangement, comprising: an electrical machine comprising one or more windings and a set of permanent magnets; a power electronics converter arranged to supply current to or receive current from the one or more windings of the electrical machine; a magnetocaloric effect (MCE) material in thermal contact with the power electronics converter; and a heat sink for removing heat from the MCE material. The MCE material is arranged in proximity to the permanent magnets of the electrical machine whereby, in use, stray magnetic flux from the permanent magnets of the electrical machine passes through the MCE material.

Thus, the arrangement of the second aspect works in substantially the same way as the arrangement of the first aspect, except that the stray flux that activates the MCE material is from permanent magnets of the machine rather than current-carrying windings. An advantage of using stray flux from permanent magnets is that permanent magnets are generally more efficient generators of flux, in that they do not suffer resistive (PR) losses as windings do. However, optimized electrical machine design usually results in an arrangement in which the amount of stray flux from permanent magnets is relatively low.

Various optional features, applicable to both the first and second aspects, will now be described.

The electrical machine and the power electronics converter may be provided within a common housing, or a housing of the electrical machine may be structurally connected to a housing of the power electronics converter. Structural integration of the machine and converter can reduce the overall mass of the arrangement and improve the ease of system assembly.

The arrangement may further comprise a cooling system for removing heat from the electrical machine. Thus, the arrangement may comprise a primary cooling system for cooling the electrical machine and a secondary cooling system, based on MCE cooling, for cooling the power electronics.

The heat sink may be arranged to transfer heat removed from the MCE material into the primary cooling system, such that the cooling system is operable to remove heat from both the electrical machine and MCE material. This integration of the primary and secondary cooling systems allows for the omission of a separate fluid circuit for the secondary cooling system, Thus, lower overall system weight may be achieved due to a reduction in piping and pumping components. There may also be a reduced risk of coolant, leakage and improved system reliability due to a reduction in moving parts.

The primary cooling system may comprise one or more conduits for carrying a cooling fluid in thermal contact with the electric machine, and the heat sink may be arranged to transfer heat removed from the MCE material into the cooling fluid. The cooling system may, for example, comprise a cooling jacket that surrounds at least a portion of the electrical machine and includes the one or more conduits for carrying the cooling fluid.

The MCE material may be located adjacent to one or more end-windings of the electrical machine. The stray flux density may be highest close to the machine end-windings, thus more pronounced magnetic refrigeration may occur if the MCE material is located adjacent to the end-windings.

The end-windings and MCE material may be located at an axial end of the electrical machine, the axial end being defined with respect to an axis of rotation of the electrical machine. The end-windings may extend in an axial direction.

The MCE material may abut one or more semiconductor switching modules of the power electronics converter. In this way the MCE material may be in close thermal contact with the heat-generating components of the converter and heat removal may be more efficient.

The MCE material may be a continuous body (e.g. a continuous piece) of MCE material that extends around an entire perimeter (e.g. an inner or outer circumference) of the power electronics converter. The use of a continuous piece of MCE material may improve the rate of heat transfer from the power electronics to the MCE material, and/or from the MCE material to the heat sink. It may also increase the thermal mass of the MCE material.

The power electronics converter may have an annular cross-section. In this case the continuous body of MCE material may also have an annular cross-section.

The electrical machine may comprise a rotor defining an axis of rotation. The electrical machine may have a first end and a second end opposite to and axially spaced apart from the first end. The power electronics converter may be located axially adjacent to the first end of the electrical machine. The MCE material may be provided axially between the first end of the electrical machine and the power electronics converter. Such an arrangement may be advantageously compact and provide relatively high usage of the stray flux for cooling.

The power electronics converter may comprise a plurality of semiconductor switching modules arranged circumferentially around a central axis. The central axis of the power electronics converter may be aligned with an axis of rotation of the electrical machine. This may allow for a particularly compact and integrated design.

The electrical machine may comprise a rotor and a stator, and the one or more windings may be stator windings.

The rotor may carry a plurality of permanent magnets.

The stator may be radially outside of and surround the rotor.

The MCE material may be Gadolinium or an alloy thereof.

According to a third aspect, there is provided a gas turbine engine comprising an integrated electrical machine and power electronics converter arrangement according to the first aspect or the second aspect. A rotor of the electrical machine may be mechanically coupled to a spool, for example a shaft or rotor of a spool, of the gas turbine engine.

According to a fourth aspect, there is provided an aircraft propulsion system comprising an integrated electrical machine and power electronics converter arrangement according to the first aspect or the second aspect. The propulsion system may be a hybrid electric propulsion system or a purely electric propulsion system.

According to a fifth aspect, there is provided an aircraft comprising: the integrated electrical machine and a power electronics converter arrangement of the first aspect or the second aspect; the gas turbine engine of the third aspect; or the propulsion system of the fourth aspect.

According to a sixth aspect, there is provided an auxiliary power unit, APU, for a vehicle comprising the integrated electrical machine and a power electronics converter arrangement of the first aspect.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION OF THE DRAWINGS

Embodiments will now be described by way of example only with reference to the accompanying drawings, which are purely schematic and not to scale, and in which.

DETAILED DESCRIPTION

FIG. 1

Figure 1:
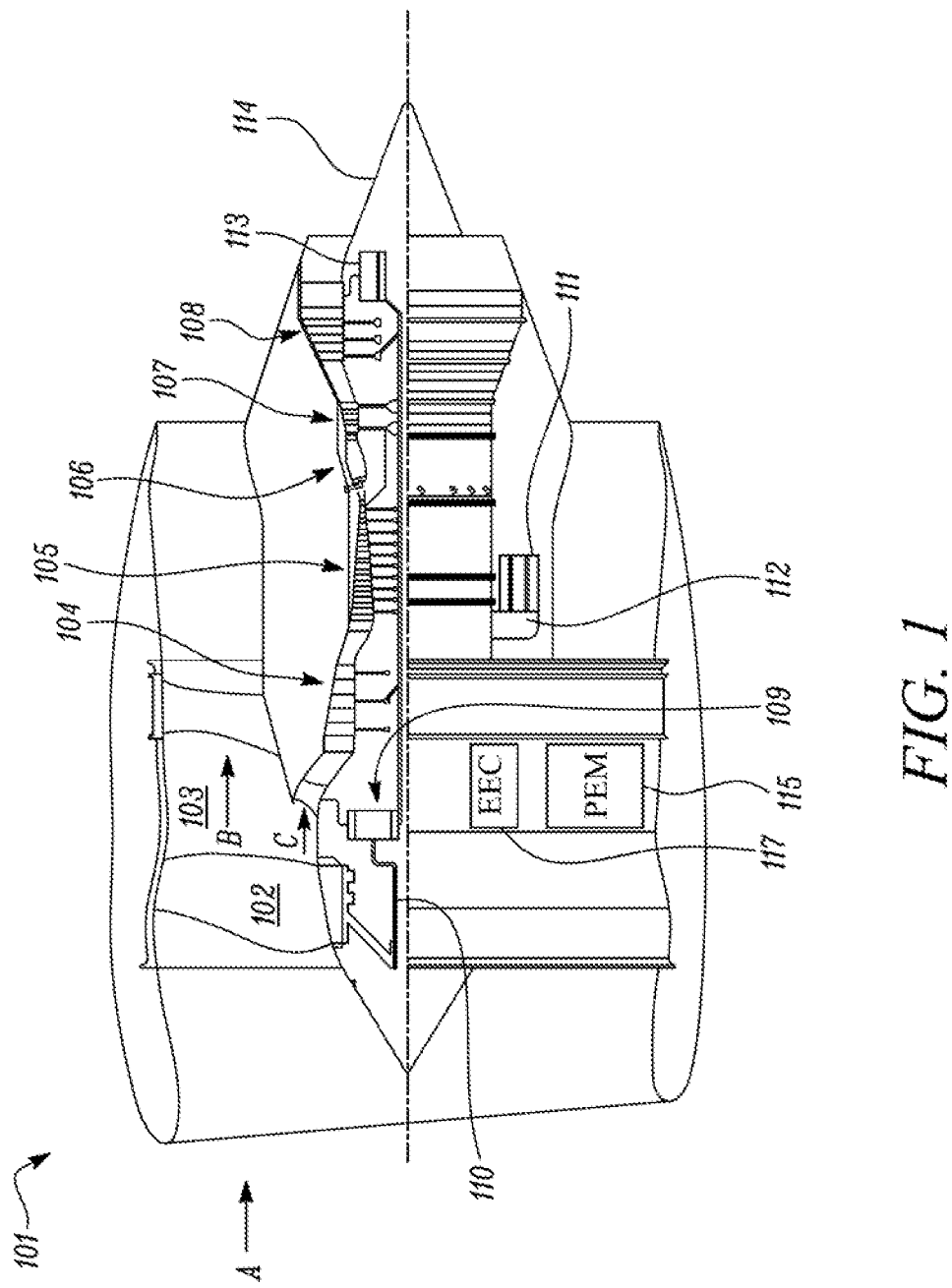
FIG. 1 shows a general arrangement of a turbofan engine for an aircraft, including a rotary electric machine on each spool thereof.

A general arrangement of an engine 101 for an aircraft is shown in FIG. 1. In the present embodiment, the engine 101 is of turbofan configuration, and thus comprises a ducted fan 102 that receives intake air A and generates two pressurised airflows: a bypass flow B which passes axially through a bypass duct 103 and a core flow C which enters a core gas turbine.

The core gas turbine comprises, in axial flow series, a low-pressure compressor 104, a high-pressure compressor 105, a combustor 106, a high-pressure turbine 107, and a low-pressure turbine 108.

In operation, the core flow C is compressed by the low-pressure compressor 104 and is then directed into the high-pressure compressor 105 where further compression takes place. The compressed air exhausted from the high-pressure compressor 105 is directed into the combustor 106 where it is mixed with fuel and the mixture is combusted. The resultant hot combustion products then expand through, and thereby drive, the high-pressure turbine 107 and in turn the low-pressure turbine 108 before being exhausted to provide a small proportion of the overall thrust.

The high-pressure turbine 107 drives the high-pressure compressor 105 via an interconnecting shaft. The low-pressure turbine 108 drives the low-pressure compressor 104 via another interconnecting shaft. Together, the high-pressure compressor 105, high-pressure turbine 107, and associated interconnecting shaft form part of a high-pressure spool of the engine 101. Similarly, the low-pressure compressor 104, low-pressure turbine 108, and associated interconnecting shaft form part of a low-pressure spool of the engine 101. Such nomenclature will be familiar to those skilled in the art.

The fan 102 is driven by the low-pressure turbine 108 via a reduction gearbox in the form of a planetary-configuration epicyclic gearbox 109. Thus in this configuration, the low-pressure turbine 108 is connected with a sun gear of the gearbox 109. The sun gear is meshed with a plurality of planet gears located in a rotating carrier, which planet gears are in turn meshed with a static ring gear. The rotating carrier drives the fan 102 via a fan shaft 110. It will be appreciated that in alternative embodiments a star-configuration epicyclic gearbox (in which the planet carrier is static and the ring gear rotates and provides the output) may be used instead.

It is increasingly desirable to facilitate a greater degree of electrical functionality on the airframe and on the engine. To this end, the engine 101 comprises one or more rotary electric machines, generally capable of operating both as a motor and as a generator. The number and arrangement of the rotary electric machines will depend to some extent on the desired functionality, Some embodiments of the engine 101 include a single rotary electric machine 111 driven by the high-pressure spool, for example by a core-mounted accessory drive 112 of conventional configuration. Such a configuration facilitates the generation of electrical power for the engine and the aircraft and the driving of the high-pressure spool to facilitate starting of the engine in place of an air turbine starter. Other embodiments, including the one shown in FIG. 1, comprise both a first rotary electric machine 111 coupled with the high pressure spool and a second rotary electric machine 113 coupled with the low pressure spool. In addition to generating electrical power and the starting the engine 101, having both first and second rotary machines 111, 113, connected by power electronics, can facilitate the transfer of mechanical power between the high and lower pressure spools to improve operability, fuel consumption etc.

As mentioned above, in FIG. 1 the first rotary electric machine 111 is driven by the high-pressure spool by a core-mounted accessory drive 112 of conventional configuration. In alternative embodiments, the first electric machine 111 may be mounted coaxially with the turbomachinery in the engine 101. For example, the first electric machine 111 may be mounted axially in line with the duct between the low- and high-pressure compressors 104 and 105. In FIG. 1, the second electric machine 113 is mounted in the tail cone 114 of the engine 101 coaxially with the turbomachinery and is coupled to the low-pressure turbine 108. In alternative embodiments, the second rotary electric machine 113 may be located axially in line with low-pressure compressor 104, which may adopt a bladed disc or bladed drum configuration to provide space for the second rotary electric machine 113. It will of course be appreciated by those skilled in the art that any other suitable location for the first and (if present) second electric machines may be adopted.

The first and second electric machines 111, 113 are connected with power electronics. Extraction of power from or application of power to the electric machines is performed by a power electronics module (PEM) 115. In accordance with the embodiment described herein, the PEM 115 may be integrated with one or both of the electrical machines 111, 113.

Control of the PEM 115 and of the first and second electric machines 111 and 113 is in the present example performed by an engine electronic controller (EEC) 117. In the present embodiment the EEC 117 is a full-authority digital engine controller (FADEC), the configuration of which will be known and understood by those skilled in the art. It therefore controls all aspects of the engine 101, i.e. both of the core gas turbine and the first and second electric machines 111 and 113. In this way, the EEC 117 may holistically respond to both thrust demand and electrical power demand. In an implementation, the one or more rotary electric machines 111, 113 and the power electronics 115 may be configured to output to or receive electric power from two dc busses.

FIG. 2

Figure 2:
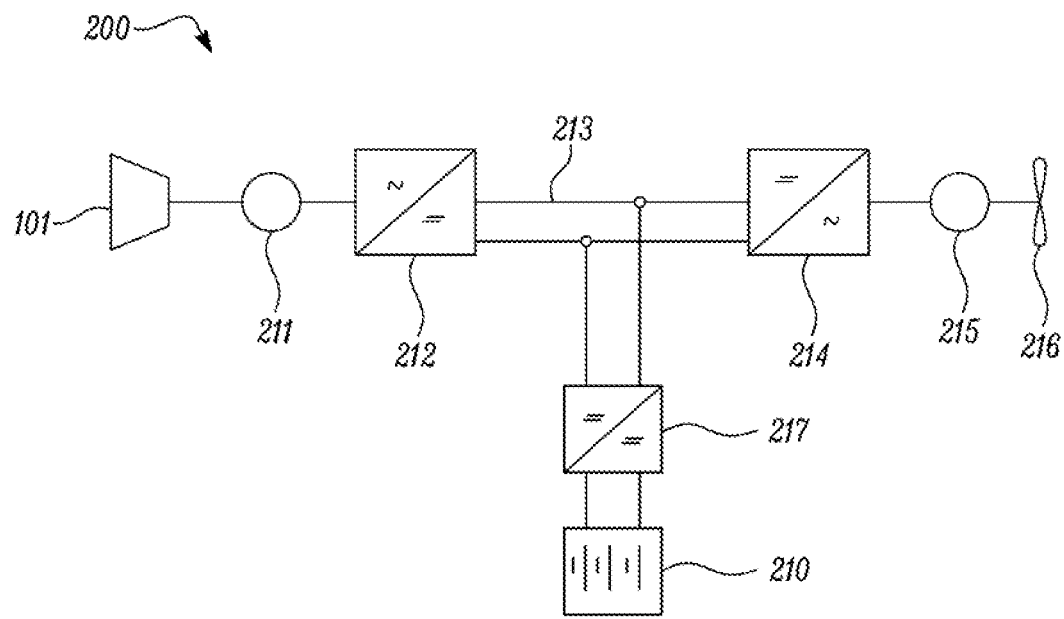
FIG. 2 is a schematic illustration of a hybrid electric aircraft propulsion system.

FIG. 2 illustrates an exemplary propulsion system 200 of a hybrid electric aircraft. Alternative hybrid electric propulsion system arrangements are known and will occur to those skilled in the art.

The propulsion system 200 includes an engine 101, such as the gas turbine engine 101 described above, and a battery pack 210. Both the engine 101 and the battery pack 210 are used as energy sources to power a motor-driven propeller 216, as well as ancillary electrical systems (not shown). The propulsion system 200 of the hybrid electric aircraft will typically further comprise a generator 211 an AC/DC converter 212, a high voltage DC (HVDC) distribution bus 213, a DC/AC converter 214, a motor 215 that drives the propeller 216, and a DC/DC converter 217.

A shaft of the engine 101 is coupled to and drives the rotation of a shaft of the generator 211 which thereby produces alternating current. The AC/DC converter 212, which faces the generator 211, converts the alternating current into direct current which is fed to various electrical systems via the HVDC distribution bus 213. These electrical systems include the motor 215 that drives the propeller 216. The motor 215 will typically be a synchronous motor that interfaces with the HVDC distribution bus 213 via the DC/AC converter 214.

The battery pack 210, which may be made up of a number of battery modules connected in series and/or parallel, is connected to the HVDC distribution bus 213 via the DC/DC converter 217. The DC/DC converter 217 converts between a voltage of the battery pack 210 and a voltage of the HVDC distribution bus 213. In this way, the battery pack 210 can replace or supplement the power provided by the engine 100 (by discharging and thereby feeding the HVDC distribution bus 213) or can be charged using the power provided by the engine 100 (by being fed by the HVDC distribution bus 213).

In accordance with the embodiment described herein, the generator 211 and the AC/DC converter 212 may be integrated together. Additionally or alternatively, the DC/AC converter 214 and the motor 215 may be integrated together.

FIG. 3

Figure 3:
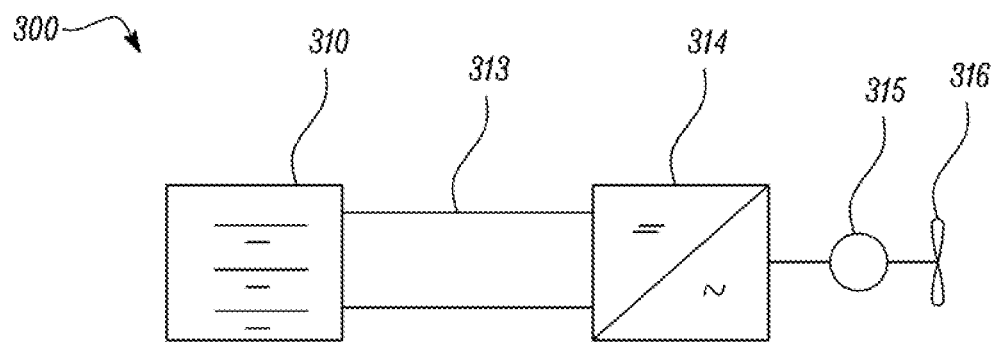
FIG. 3 is a schematic illustration of a purely electric aircraft propulsion system.

FIG. 3 illustrates an exemplary electric propulsion system 300 of a purely electric aircraft. Alternative electric propulsion system arrangements are known and will occur to those skilled in the art.

The propulsion system 300 includes a battery pack 310 that feeds a HVDC distribution bus 313, possibly via DC/DC converter (not shown), which delivers power to one or more synchronous motors 315 via a DC/AC converter 314. The one or more motors 315 drive the one or more propellers 316 that propel the aircraft.

In accordance with the embodiment described herein, the DC/AC converter 314 and the motor 315 may be integrated together.

FIG. 4

Figure 4:
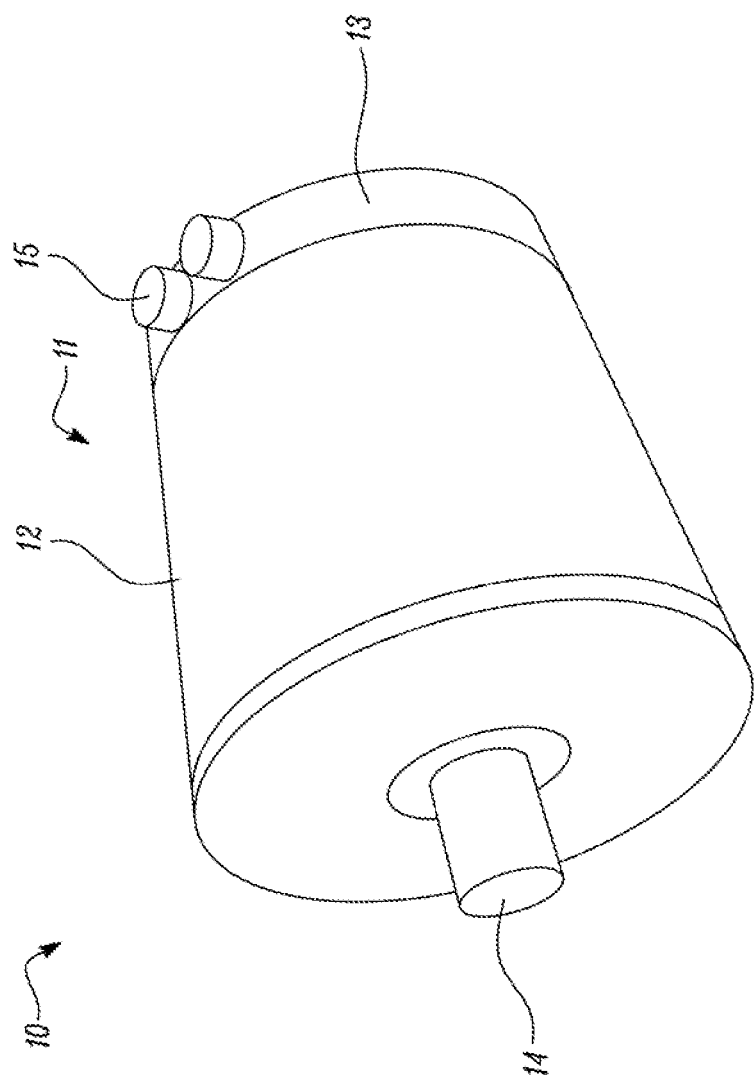
FIG. 4 is a perspective view of an integrated electrical machine and power electronics converter.

FIG. 4 illustrates an integrated arrangement 10 comprising an electrical machine and a power electronics converter.

The arrangement 10 is provided within a housing 11, which in this example includes a machine housing 12 that houses the electrical machine and a converter housing 13 that houses the converter. The converter housing 13 is located at one axial end of the machine housing 12 and is structurally attached to the machine housing 12 by fasteners. It will be appreciated that the housing 11 may instead be a single, integrally formed, housing as opposed to two attached housing portions 12, 13.

At the axial end opposite to the converter housing 13, a rotor of the electrical machine is connected to a shaft. The shaft is generally indicated at 14. When the arrangement 10 is configured as a motor, a rotor of the electrical machine drives the shaft 14. When configured as a generator, the shaft 14 drives the rotor of the electrical machine.

Portions of the electrical connections 15 of the power electronics converter are also visible. The electrical connections 15 supply current to (or receive current from) the converter, which itself supplies current to (or receives current from) the windings of the electrical machine.

In the example described herein, the electrical machine is a three-phase permanent magnet motor-generator (PMMG) of radial flux configuration. It will however be understood that different numbers of phases and different types and configurations of electrical machine are consistent with the embodiments. For example, the machine may instead be a four-phase machine, may instead be an induction machine or a switched-reluctance machine, and/or may instead be of axial flux configuration.

The power electronics converter may be of any type suitable for the desired application. In one example, the converter is a three-phase, bi-directional (AC-DC/DC-AC) converter with Wide Band Gap (WGB) semiconductor switching modules (e.g. Silicon Carbide switching modules) of an H-bridge configuration. However, other numbers of phases, other semiconductor materials, and/or other switching configurations (e.g. a full bridge configuration or a neutral point clamped configuration) could also be used.

Whilst the specific example described herein shows the converter located at an axial end of the electrical machine, it is to be understood that this is not necessarily the case. For instance, the converter may be located radially outside of (e.g. circumferentially surrounding) the electrical machine. Such an arrangement may be particularly convenient where the electrical machine is of an axial flux configuration.

FIG. 5

Figure 5:
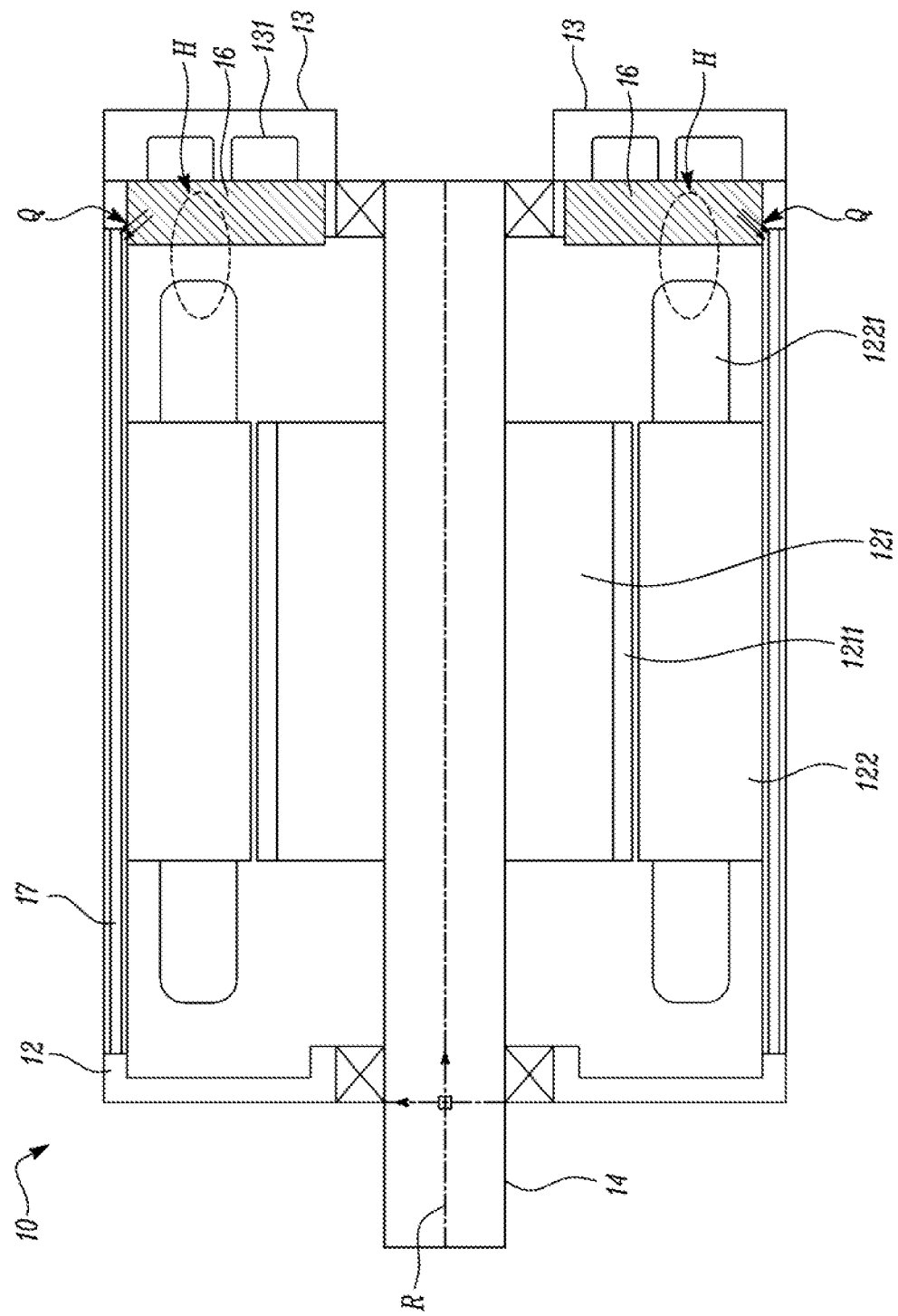
FIG. 5 is a cross-sectional side view of an integrated electrical machine and power electronics converter with a primary liquid cooling system and a secondary MCE cooling system.

FIG. 5 shows the integrated electrical machine and power electronics converter 10 in schematic cross-section.

The electrical machine, which as before is provided within a machine housing 12, includes a rotor 121 and a stator 122. The rotor 121, which carries permanent magnets 1211 on its radially outer surface, is mechanically connected to and rotates with the shaft 14 and defines an axis of rotation R. The stator 122, which circumferentially surrounds the rotor 121, includes windings of a conductive material (e.g. copper) wound around the teeth of a magnetically permeable core. Any suitable winding configuration may be adopted, and various winding configurations are known and will occur to those skilled in the art. In this embodiment, the windings include axially projecting end-windings 1221, which are the portions of the windings where the conductor turns to allow reversal of the direction of current flow in the core of the machine.

Figure 6:
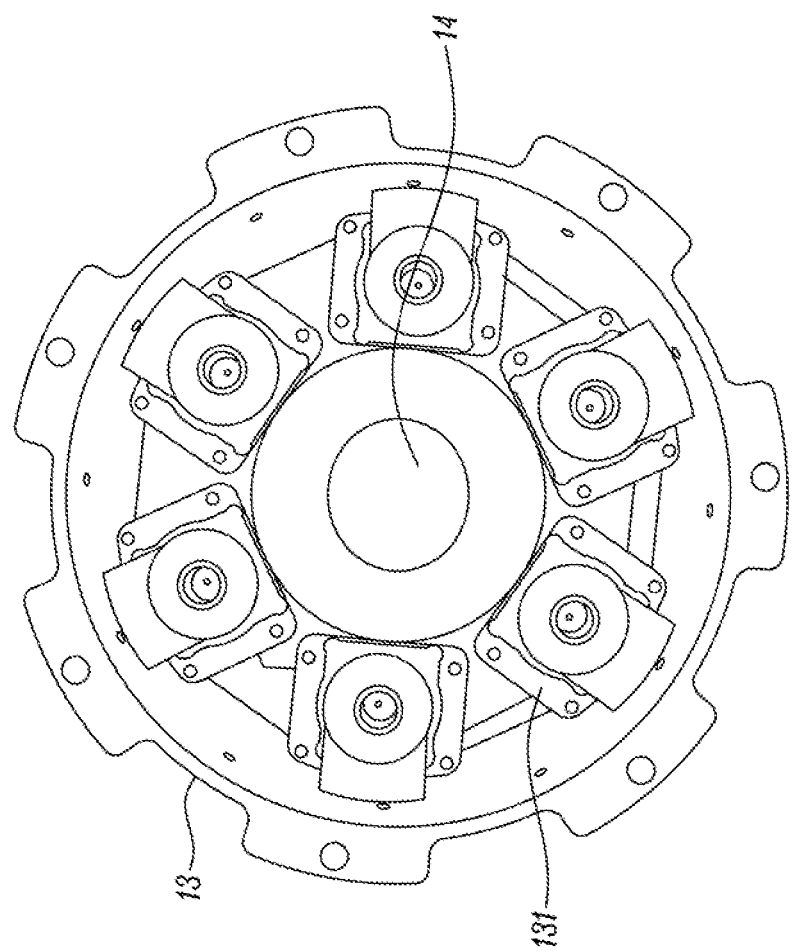
FIG. 6 is an axial end view of a power electronics portion of an integrated electrical machine and power electronics converter.

The power electronics converter, which as before is provided within a converter housing 13 located at one axial end of the arrangement 10, includes a number of semiconductor switching modules 131. The semiconductor switching modules 131 convert between alternating current and direct current and supply alternating current to, or receive alternating current from, the windings of the stator 122 of the electrical machine. In this embodiment, the converter housing 13 has an annular form factor and has a central axis that is coaxial with the axis of rotation R of the electrical machine. As shown in FIG. 6, the semiconductor switching modules 131 are arranged circumferentially around the axis of rotation R. It will however be understood that this is only an example and that the converter may not have an annular form factor and the switching modules 131 may be arranged in any suitable fashion.

In a motor mode of operation, the supply of alternating current to the windings of the stator 122 generates a rotating magnetic field which interacts with the magnetic field of the permanent magnets 1211. This interaction generates torque which drives the rotation of the rotor 121. In a generator mode of operation, the rotor 121 is driven to rotate by the shaft, which results in rotation of the magnetic field of the permanent magnets 1211. The rotating magnetic field induces alternating current in the windings of the stator 122. It will be appreciated that the current induced in the stator windings also generates a magnetic field.

Electrical machines are typically designed so that the magnetic flux generated by the permanent magnets 1211 of the rotor and by the windings of the stator 122 is, as much as possible, confined within the electrical machine. This is because magnetic flux that leaks outside of the machine—known as "stray flux"—cannot contribute to the interaction that generates torque (in motor mode) or induces current (in generator mode) and thus reduces the efficiency and power density of the machine. The amount of stray flux from the permanent magnets 1211 is usually very small because the permanent magnets typically face the internals of the electrical machine and are located away from its edges. However, the amount of stray flux from the windings of the stator 122 may be much larger. This is because the edges of the stator windings are usually more exposed, particularly the end-windings 1221 of the stator 122 where the direction of current flow reverses. In a radial flux machine such as the one shown in FIG. 5, the end-windings 1221 usually extend in an axial direction and generate stray flux (illustrated by the dotted lines labelled 'H') in the region surrounding the end-windings 1221.

According to the present disclosure, the integrated arrangement 10 includes a magnetocaloric effect (MCE) material 16. The location of the MCE material 16 is selected so that it is within a region of the arrangement 10 in which stray flux from the electrical machine is present, so that the MCE material 16 is activated by the stray flux. Furthermore, the material 16 is arranged in thermal contact with the power electronics converter, such that heat generated by the converter can be transferred from the converter into the MCE material 16. The cyclic application of the stray flux, which inherently occurs because the current supplied to or induced in the windings is alternating current, results in cycles of magnetic refrigeration that draw heat from the power electronics converter into the MCE material 16. The heat can then be removed from the MCE material 16 via a heat sink. The removal of heat from the MCE material 16 to a heat sink is illustrated by the arrows labelled 'Q' in FIG. 5, The magnetocaloric effect and the cycle of magnetic refrigeration are described in more detail with reference to FIG. 7.

In the embodiment of FIG. 5, in which the density of stray magnetic flux H is highest in the regions surrounding the axially extending end-windings 1221 and the power electronics converter is located at an axial end of the electrical machine, the MCE material 16 is conveniently located axially between the end-windings 1221 and the power electronics converter. In order to increase the efficiency of heat transfer between the power electronics converter and the MCE material 16 the MCE material 16 may abut (i.e. may be in direct or very close physical contact with) the heat-generating semiconductor switching modules 131. Furthermore, to increase the activation and thermal mass of the MCE material 16, a continuous, annular piece of MCE material 16 may be provided about the full circumference of the machine and power electronics converter. In alternative embodiments where the power electronics converter is not of annular cross-section, the continuous piece of MCE material may have another cross-section. For example, if the power electronics converter has a circular cross-section then the continuous piece of MCE material 16 may be of circular cross-section, More generally, the continuous piece of MCE material may extend around the full perimeter (e.g. circumference) of the power electronics converter.

The MCE material 16 may additionally or alternatively be located in one or more different regions in which there is stray flux. As one example, MCE material may be provided in a region radially surrounding the axially extending end-windings 1221. In this case, thermal contact between the MCE material and the power electronics converter may be ensured by providing a thermal path (for example a thermally conductive medium) between the two, or by locating the converter and its semiconductor switching modules 131 elsewhere (radially outside of the end-windings 1221, for example). As another example, the end-windings 1221 may include a radially extending portion, and the converter and its switching modules 131 may be radially or axially adjacent to the radially extending end-windings. End-windings are commonly radially extending in axial flux machines. In this case the converter may conveniently circumferentially surround the electrical machine and its end-windings, with the MCE material arranged radially between the end-windings and the radially adjacent power electronics converter.

While the use of stray flux from the windings of the stator 122 of the electrical machine has been described, it is contemplated that the MCE material may additionally or alternatively be activated by stray flux from rotor windings (in a wound-rotor machine) or from permanent magnets of a stator or a rotor. As noted above, the amount of stray flux from permanent magnets is typically low, so the use of stray flux from field windings will generally provide a greater MCE cooling capability. However, if the machine design is such that permanent magnets do provide a usable amount of stray flux, suitably located MCE material could be used.

As was briefly mentioned above, the arrangement 10 includes a heat sink for carrying heat (Q) away from the MCE material 16. The heat sink can take any suitable form. In the embodiment of FIG. 5, the heat sink is or cooperates with a cooling system 17 (hereafter referred to as the primary cooling system) which also removes heat from the electrical machine. Such integration of the MCE cooling system (which may be described as the secondary cooling system) with the primary cooling system 17 may helpfully reduce the component count, reduce the system weight and/or increase the system reliability by reducing the scope for coolant leakage or the failure of components such as pumps.

In more detail, the arrangement 10 includes a primary cooling system in the form of a cooling jacket 17 that is incorporated into the electrical machine housing 12 and surrounds the stator 122. The cooling jacket 17 includes one or more conduits that carry a cooling fluid, preferably a liquid coolant, in thermal contact with the stator windings. Heat generated in the stator due to the resistance of the windings is transferred into the coolant and carried away, for example to a heat exchanger where it can be dissipated outside of the arrangement 10. The MCE material 16, which removes heat from power electronics converter, is arranged to transfer heat (Q) into the primary cooling system 17. In this way, the coolant which carries away heat from the electrical machine also carries away heat from the power electronics. The heat (Q) may be transferred from the MCE material to the primary cooling system 17 in any suitable way. For instance, a surface of the MCE material 16 may be in contact with one or more external walls of one or more coolant conduits of the primary cooling system 17. As another example, there may be an intermediate heat transfer element, such as a high surface area heat exchanger or thermal adhesive, between the MCE material 16 and the primary cooling system 17.

In other embodiments, the heat sink may take the form of a dedicated cooling system completely independent from the primary cooling system 17. For example, there may be a separate fluid circuit, with its own supply of coolant and pumping components, which receives heat (Q) from the MCE material 16 and carries the heat away for dissipation outside of the arrangement 10.

FIG. 6

FIG. 6 is an axial end view of the power electronics converter shown in FIG. 5.

As mentioned previously, the converter housing 13 has an approximately annular shape with a central axis that is aligned with the axis of rotation R of the rotary electrical machine. The semiconductor switching modules 131 are arranged around the axis. When attached to the remainder of the integrated arrangement 10, the semiconductor switching modules 131 are in thermal contact with the MCE material 16 to facilitate transfer of heat from the converter to the MCE material, as described above.

FIG. 7

The magnetocaloric effect—also known as adiabatic demagnetization—is a phenomenon in which a material changes temperature in response to a change in an externally applied magnetic field. The effect is known to occur in a number of materials including elemental Gadolinium and some of its alloys, Praseodymium alloyed with Nickel (PrNi$_5$) and others.

Figure 7:
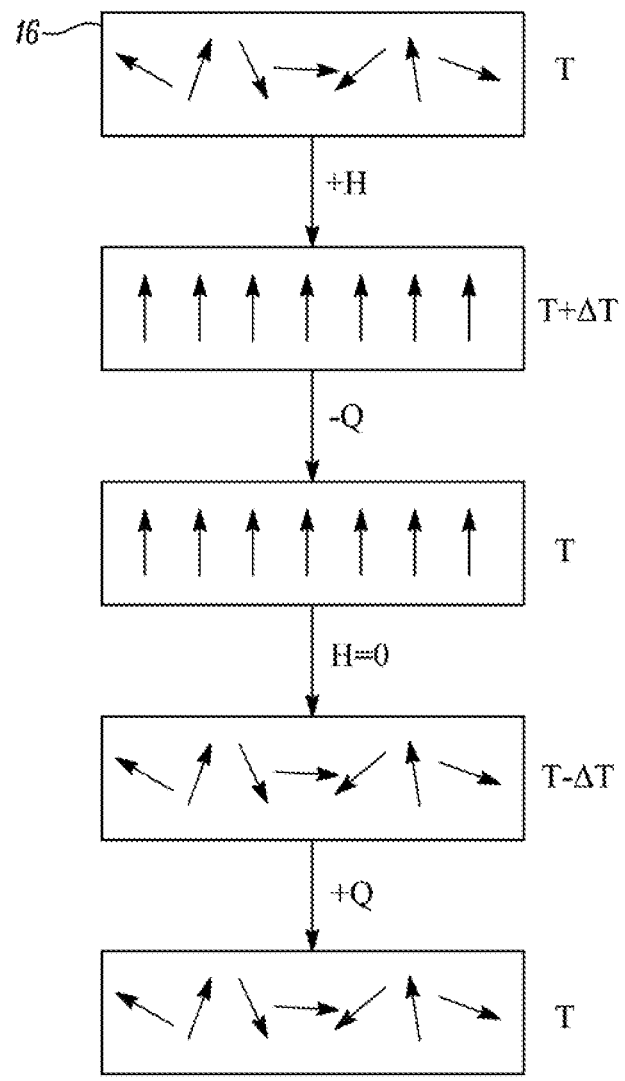
FIG. 7 is a flow diagram illustrating a magnetic refrigeration cycle for cooling a power electronics converter in an integrated electrical machine and power electronics converter arrangement.

The MCE can be exploited to create a cycle of magnetic refrigeration in which a magnetic field is cyclically applied and removed in order to remove heat from a body. Such a cycle is illustrated in FIG. 7 and is described below in the context of the present disclosure, in which an MCE material 16 is located in a region where there is stray magnetic flux from an electrical machine and is in is thermal contact with a power electronics converter.

In the first box, the integrated arrangement 10 has been inactive for some time. Consequently, the power electronics converter and the MCE material 16 are in thermal equilibrium at a temperature T. There is no applied magnetic field, and consequently the alignment of the magnetic dipoles of the material 16 (represented by the arrows) is random.

When the arrangement 10 is switched on, in this example in a motor mode of operation, the power electronics converter supplies the stator windings of the electrical machine with current. The current in the windings creates a magnetic field. The majority of the magnetic flux of the stator magnetic field is confined within the electrical machine and interacts with the magnetic field of the permanent magnets 1211 of the rotor 121 to develop toque. However, some magnetic flux—the stray flux—leaks outside of the electrical machine and passes through the MCE material 16.

Referring to the second box, the passage of the stray flux (+H) through the MCE material 16 causes its magnetic dipoles to align with the field lines. Since the material 16 exhibits the MCE, the decrease in magnetic entropy associated with the alignment of the dipoles is associated with a drop in the heat capacity of the material 16. The drop in heat capacity results in an increase in temperature from T to T+ΔT.

Since the MCE material 16 is in thermal contact with a heat sink (the primary cooling system 17, for example), heat (Q) is carried away from the MCE material. Thus, referring to the third box of FIG. 7, the MCE material 16 returns to its previous temperature (T).

The current supplied to the stator windings is alternating current, and so the stray magnetic flux density quickly drops from its maximum value (H) to zero. As shown in the fourth box of FIG. 7, with zero stray flux passing through the MCE material 16, the alignment of the magnetic dipoles of the material again becomes random. The resulting drop in entropy results in an increase in the heat capacity of the material 16. The increase in heat capacity results in a change in temperature from T to T−ΔT.

In the meantime, the semiconductor switching modules 131 of the converter have generated heat due to their electrical resistance and their active switching elements. The temperature of the converter has therefore increased from T to a higher temperature. There is consequently a temperature gradient between the power electronics converter and the MCE material 16, and so heat (Q) flows from the power electronics converter to the MCE material. Referring to the final box of FIG. 7, the flow of heat (+Q) into the MCE material 16 increases its temperature from T−ΔT to T.

It will be appreciated that FIG. 7 only illustrates one half of one AC cycle of the electrical machine. After the final box of FIG. 7, the alternating current and thus the stray magnetic flux density would increase from zero to a maximum value in the negative direction, resulting in alignment of the magnetic dipoles anti-parallel to that shown in the second and third boxes. This anti-parallel alignment of the dipoles would equally result in a drop in heat capacity and thus temperature increase in the MCE material 16. After this, the magnitude of the alternating current and thus stray magnetic flux density would reduce to zero and the cycle would effectively return to the first box of FIG. 7.

It should also be appreciated that the use of the MCE in this context may create a feedback loop that further enhances the cooling, and thus the efficiency, of the power electronics and may increase the power density of the arrangement 10. Specifically, cooling the power electronics converter reduces its losses and can result in a higher current being supplied to the windings of the electrical machine. Supplying a higher current to the windings leads to a higher stray magnetic flux density and thus greater MCE cooling capability, and thus further improvements in the operation of the power electronics.

Various examples have been described, each of which feature various combinations of features. It will be appreciated by those skilled in the art that, except where clearly mutually exclusive, any of the features may be employed separately or in combination with any other features and the embodiments extend to and includes all combinations and sub-combinations of one or more features described herein.

It will also be appreciated that whilst the embodiments have been described with reference to aircraft and aircraft propulsion systems, the integrated electrical machine and power electronics converter described herein could be used for many other applications. These include, but are not limited to, automotive, marine and land-based applications. The integrated arrangement could also be used in an Auxiliary Power Unit (APU) of an aerospace, marine or land-based system.

The invention claimed is:

1. An integrated electrical machine and power electronics converter arrangement, comprising:
   an electrical machine comprising one or more windings;
   a power electronics converter arranged to supply current to or receive current from the one or more windings of the electrical machine;
   a magnetocaloric effect, (MCE), material in thermal contact with the power electronics converter; and
   a heat sink for removing heat from the MCE material,
   wherein the MCE material is arranged in proximity to the one or more windings of the electrical machine whereby, in use, stray magnetic flux from the windings of the electrical machine passes through the MCE material.

2. The arrangement of claim 1, wherein the electrical machine and the power electronics converter are provided within a common housing, or wherein a housing of the electrical machine is structurally connected to a housing of the power electronics converter.

3. The arrangement of claim 1, further comprising a cooling system for removing heat from the electrical machine.

4. The arrangement of claim 3, wherein the heat sink is arranged to transfer heat removed from the MCE material into the cooling system, such that the cooling system is operable to remove heat from both the electrical machine and the MCE material.

5. The arrangement of claim 4, wherein the cooling system comprises one or more conduits for carrying a cooling fluid in thermal contact with the electric machine, and wherein the heat sink is arranged to transfer heat removed from the MCE material into the cooling fluid.

6. The arrangement of claim 5, wherein the cooling system comprises a cooling jacket that surrounds at least a portion of the electrical machine and includes the one or more conduits for carrying the cooling fluid.

7. The arrangement of claim 1, wherein the MCE material is located adjacent to one or more end-windings of the electrical machine.

8. The arrangement of claim 7, wherein the electrical machine has an axis of rotation, and wherein the end-windings and MCE material are located at an axial end of the electrical machine.

9. The arrangement of claim 7, wherein the one or more end-windings extend in an axial direction.

10. The arrangement of claim 1, wherein the MCE material abuts one or more semiconductor switching modules of the power electronics converter.

11. The arrangement of claim 1, wherein the MCE material is a continuous piece of MCE material that extends around an entire perimeter of the power electronics converter.

12. The arrangement of claim 11, wherein the power electronics converter has an annular cross-section and the continuous piece of MCE material also has an annular cross-section.

13. The arrangement of claim 1, wherein:
the electrical machine comprises a rotor defining an axis of rotation;
the electrical machine has a first end and a second end opposite to and axially spaced apart from the first end;
the power electronics converter is located axially adjacent to the first end of the electrical machine; and
the MCE material is provided axially between the first end of the electrical machine and the power electronics converter.

14. The arrangement of claim 1, wherein the power electronics converter comprises a plurality of semiconductor switching modules arranged circumferentially around a central axis.

15. The arrangement of claim 14, wherein the central axis of the power electronics converter is aligned with an axis of rotation of the electrical machine.

16. A gas turbine engine comprising the integrated electrical machine and power electronics converter arrangement of claim 1, wherein a rotor of the electrical machine of the arrangement is mechanically coupled to a spool of the gas turbine engine.

17. An Auxiliary Power Unit (APU) comprising the integrated electrical machine and power electronics converter arrangement of claim 1.

18. An aircraft propulsion system comprising the integrated electrical machine and power electronics converter arrangement of claim 1.

19. An aircraft comprising the integrated electrical machine and a power electronics converter arrangement of claim 1.

20. An integrated electrical machine and power electronics converter arrangement, comprising:
an electrical machine comprising one or more windings and a set of permanent magnets;
a power electronics converter arranged to supply current to or receive current from the one or more windings of the electrical machine;
a magnetocaloric effect (MCE) material in thermal contact with the power electronics converter; and
a heat sink for removing heat from the MCE material,
wherein the MCE material is arranged in proximity to the permanent magnets of the electrical machine whereby, in use, stray magnetic flux from the permanent magnets of the electrical machine passes through the MCE material.

* * * * *